United States Patent [19]

Stultz

[11] Patent Number: 5,073,698

[45] Date of Patent: Dec. 17, 1991

[54] METHOD FOR SELECTIVELY HEATING A FILM ON A SUBSTRATE

[75] Inventor: Timothy J. Stultz, San Jose, Calif.

[73] Assignee: Peak Systems, Inc., Fremont, Calif.

[21] Appl. No.: 498,670

[22] Filed: Mar. 23, 1990

[51] Int. Cl.⁵ .......................... F27B 5/14; F27D 11/02
[52] U.S. Cl. ..................................... 219/405; 427/55; 219/411
[58] Field of Search ........................ 219/405, 411, 390; 392/308, 416, 418, 419, 424; 427/167, 74, 55, 38

[56] References Cited

U.S. PATENT DOCUMENTS

| | | | |
|---|---|---|---|
| 2,824,943 | 2/1958 | Laughlin | 219/411 |
| 3,249,741 | 5/1966 | Mills | 219/411 |
| 4,575,616 | 3/1986 | Bergendal | 219/405 |
| 4,665,306 | 5/1987 | Roland | 219/411 |
| 4,680,450 | 7/1987 | Thorson et al. | |
| 4,755,654 | 7/1988 | Crowley | 219/405 |
| 4,820,906 | 4/1989 | Stultz | 219/405 |

Primary Examiner—Teresa J. Walberg
Attorney, Agent, or Firm—Townsend and Townsend

[57] ABSTRACT

A method for selectively heating a film on a substrate. The film is provided with a different absorption characteristic for light than the absorption characteristic of the substrate. The specimen (combined film and substrate) is illuminated by light having a maximum intensity at a wavelength which will be substantially absorbed by the film and substantially not absorbed by the substrate.

14 Claims, 7 Drawing Sheets

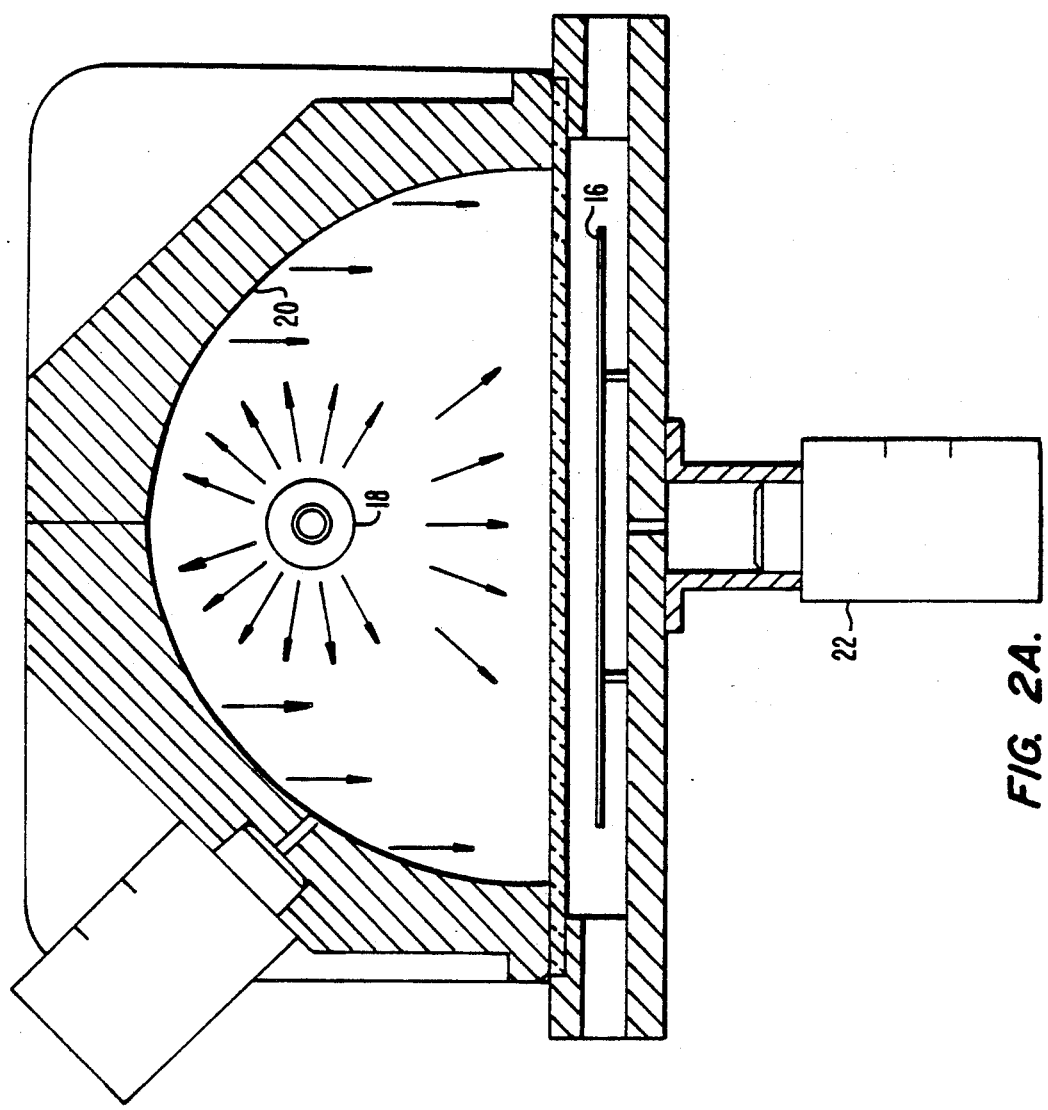

METHOD FOR SELECTIVELY HEATING A FILM ON A SUBSTRATE

A related application entitled "Method for Selectively Curing a Film on a Substrate" is being filed concurrently herewith.

BACKGROUND OF THE INVENTION

The present invention relates to methods for heating a film on a substrate. For example, in the manufacture of a flat panel display, a film of amorphous silicon is placed over a glass substrate. The silicon is subjected to normal semiconductor wafer processing techniques to form transistors along the top or bottom and one side, with an array of lines extending through the display from the transistor to create a grid of interconnections. Each element in the display is activated by turning on the appropriate two transistors whose lines intersect at that element. When amorphous silicon is used, the size of the display is limited because an amorphous silicon transistor has a limited distance of a line that it can drive.

Crystalline or large grain polycrystalline silicon is preferable to amorphous silicon because it has a mobility on the order of 300–400, compared to a mobility of approximately one for an amorphous silicon transistor. Amorphous silicon can easily be applied in a film on a substrate of glass. To convert the amorphous silicon into polycrystalline silicon, it must be subjected to high temperatures (in excess of 600° C). Unfortunately, glass will warp at such a high temperature. Quartz can be used as a substrate since it will not warp at this high temperature, but it is much more expensive than glass. Thus, flat panel displays are either small and use amorphous silicon on glass, or are larger with crystalline silicon on quartz, or use some other techniques. Other techniques include liquid crystal displays (LCD), which do not use active transistors for switching and consequently have a slower response.

One method used to recrystallize amorphous silicon without substantially heating the glass is the use of a laser beam. Unfortunately, because the laser beam is small, it must be raster-scanned in an overlapping pattern, which may result in non-uniform heating and takes a lot of time and power.

SUMMARY OF THE INVENTION

The present invention is a method for selectively heating a film on a substrate. The film is provided with a different absorption characteristic for light than the absorption characteristic of the substrate. The specimen (combined film and substrate) is illuminated by light having a maximum intensity at a wavelength which will be substantially absorbed by the film and substantially not absorbed by the substrate.

In one embodiment, the substrate is glass and the film is amorphous silicon. The light is generated using a gas-discharge lamp filled primarily with xenon gas, whose maximum spectral distribution occurs at wavelengths between approximately 800 and 1200 nanometers. Preferably, a pyrometer is used to detect the heating of the film and provide a feedback to the light source. This provides a closed-loop system, which is not feasible for a prior art laser device, which heats only a small portion of the specimen at a time.

The present invention can be used in one embodiment with a light source which illuminates the entire specimen at one time. Alternately, a light source can illuminate a strip of the specimen with relative movement between the light source and specimen being provided to move the scan line across the specimen. The pyrometer in this embodiment would remain aligned with the light source so that it detects the heating of the scan line portion.

The present invention allows for rapid heating at high temperatures of a film without corresponding heating of the substrate. This process can be used for the implant anneal phases of silicon thin film processing, for metal alloying (alloying the metal to the silicon) and for the deposition of thin films. The present invention can also be used to manufacture solar cells, such as cadmium sulfite on glass, and can be used to heat other thin films on transparent substrates.

For a fuller understanding of the nature and advantages of the invention, reference should be made to the ensuing detailed description taken in conjunction with the accompanying drawings.

BRIEF DESCRIPTION OF THE DRAWINGS

FIGS. 2A and 2B are front and side views of an embodiment of the present invention using total illumination of the substrate;

DETAILED DESCRIPTION OF THE PREFERRED EMBODIMENTS

Figure 1:
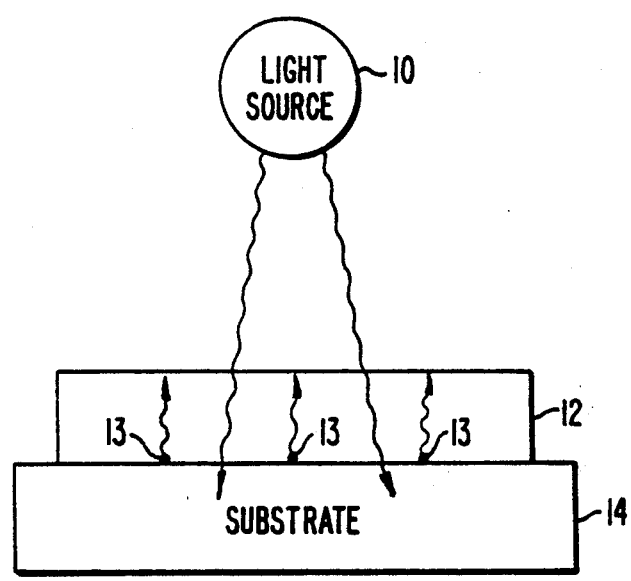
FIG. 1 is a diagram of the selective heating of a film on a substrate according to the present invention.

FIG. 1 shows a light source 10 which illuminates a film 12 on a substrate 14. Light source 10 is chosen to provide light with a maximum intensity at a wavelength which will be absorbed by film 12 and not absorbed by substrate 14. For semiconductor material, this is accomplished by choosing a light source with photon output having energies greater than the energy gap of the material, while using a substrate 14 which has an energy gap which is not exceeded by the energy of a photon of the chosen wavelength. In one embodiment, the film is an opaque material, while the substrate is a transparent material.

One light source which could be used for light source 10 is disclosed in U.S. Pat. No. 4,820,906, and is hereby incorporated herein by reference. A chamber which could be used for holding the film and substrate while illuminating the substrate is shown in U.S. Pat. No. 4,755,654, also hereby incorporated herein by reference.

Figure 2B:
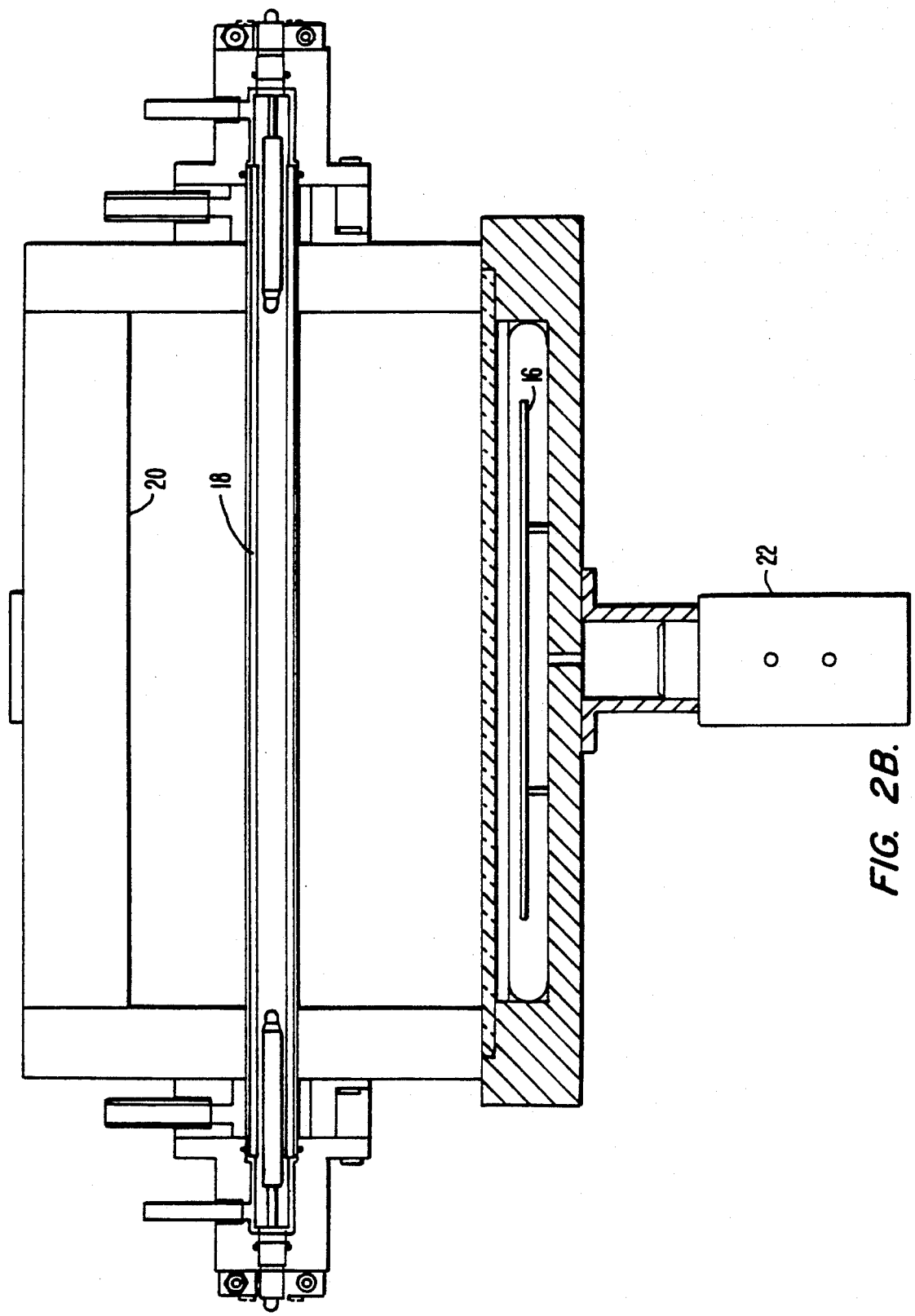

FIGS. 2A and 2B are front and side views of the arrangement shown in more detail in the '654 patent. The specimen 16, consisting of the film and substrate, is placed beneath a light source 18. A reflector 20 above the light source concentrates light on the specimen 16. A pyrometer 22 beneath the specimen 16 detects the infrared light given off by the specimen as it is heated, and provides feedback to the controls for the light source.

Figure 3:
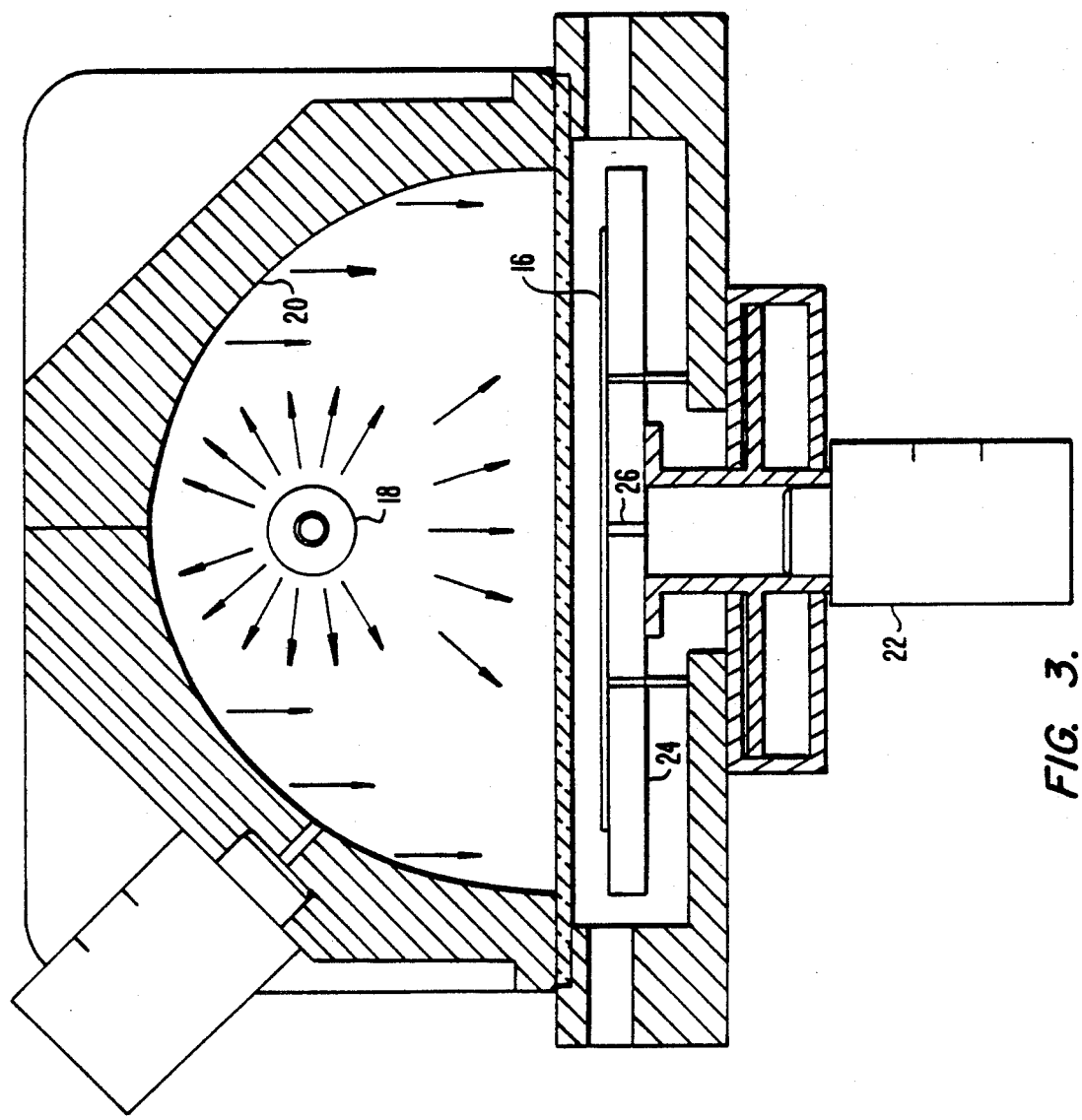
FIG. 3 is a diagram of the embodiment of FIG. 2A with a heat sink.

FIG. 3 shows a similar arrangement with the addition of a heat sink 24. A through-hole 26 is provided in the center of the heat sink so that pyrometer 22 can view specimen 16. In one embodiment, the heat sink is steel and is water cooled. Because the substrate 14 will be in contact with the heat sink, this will further aid in keeping the substrate cool while allowing the film 12 to heat.

Figure 4A:
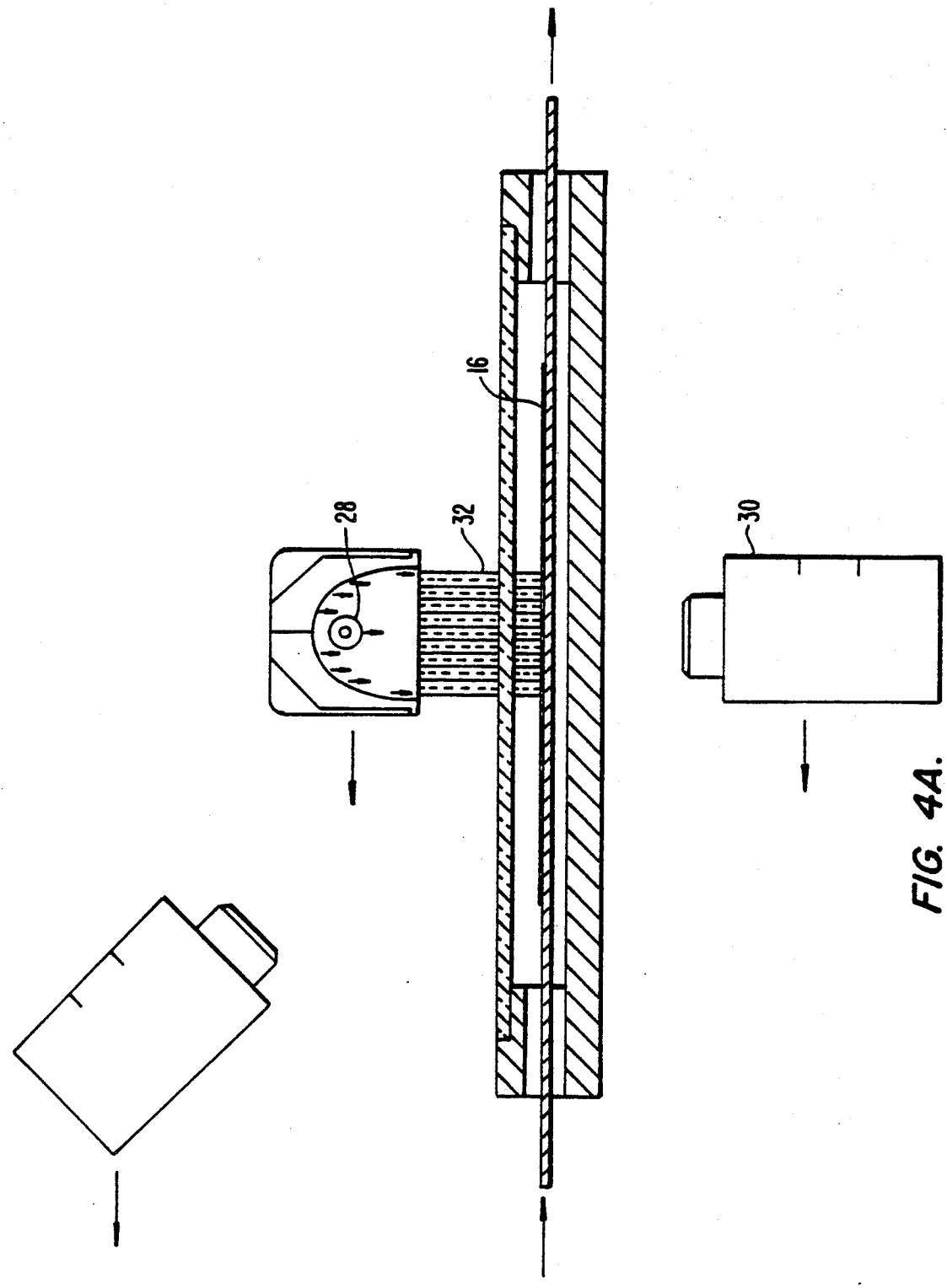
FIGS. 4A and 4B are front and side views of an embodiment of the present invention in which a scan line of light is moved, across the substrate.
Figure 4B:
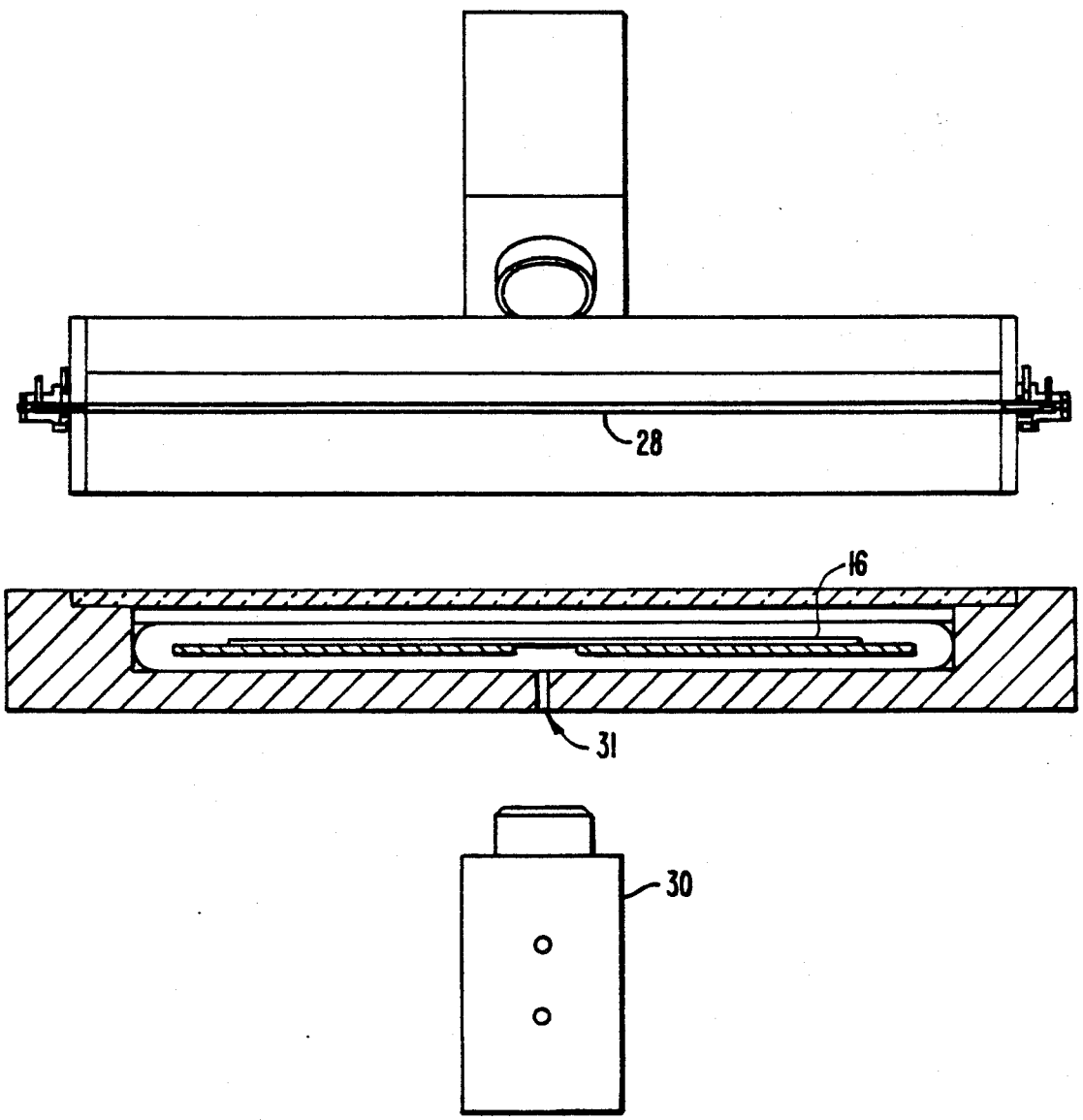

FIGS. 4A and 4B are front and side views of an alternate embodiment in which a light source 28 and pyrometer 30 are moved in alignment relative to specimen 16. Light source 28 and pyrometer 30 could be fixed, while specimen 16 is moved across the gap between them. Alternately, specimen 16 could remain still while light source 28 and pyrometer 30 are moved. A scan line defined by lines 32 illuminates a portion of specimen 16 at any one time. A longitudinal slot 31 allows light to pass to pyrometer 30.

Figure 5:
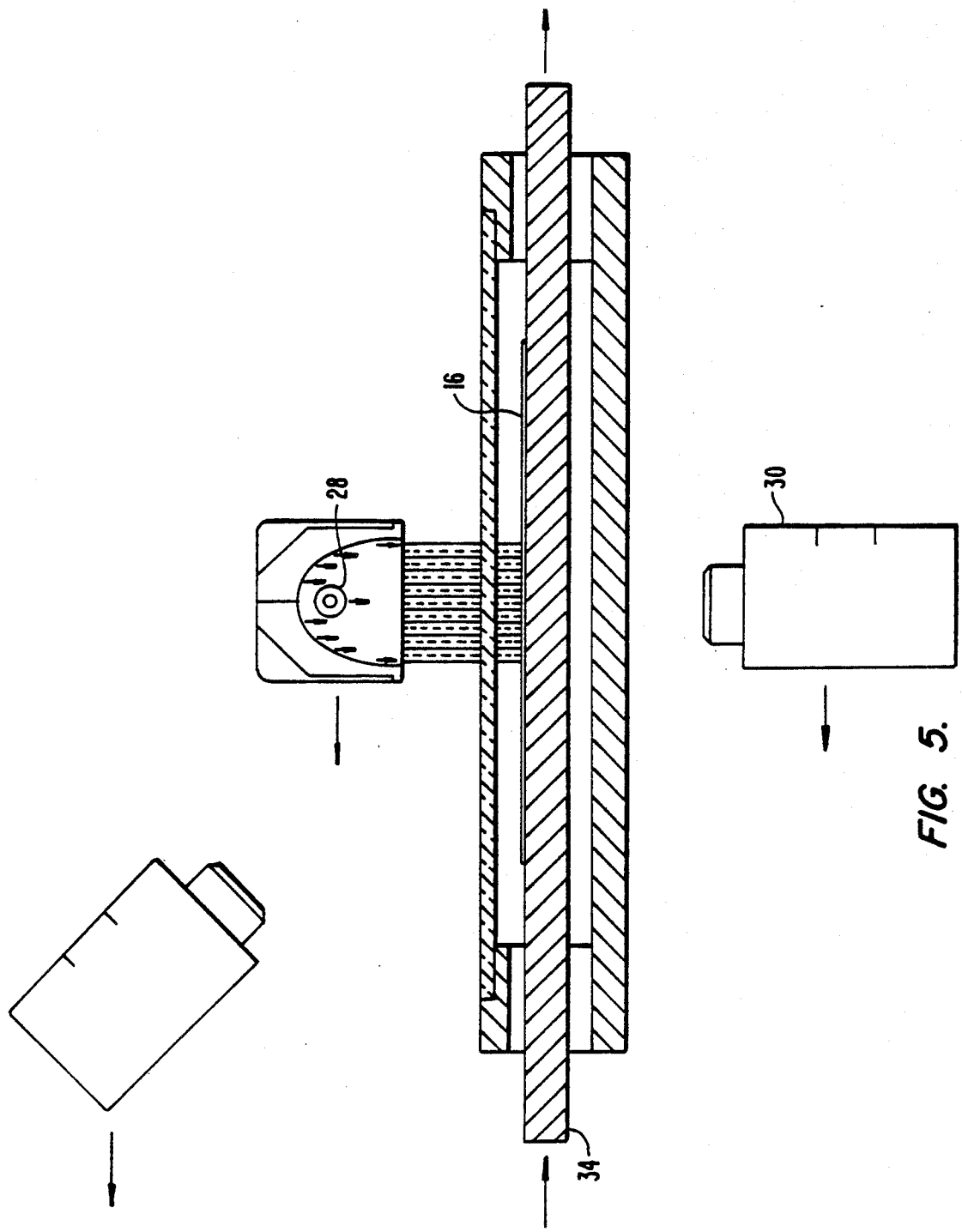
FIG. 5 is a diagram of the embodiment of FIG. 4A with a heat sink.

FIG. 5 shows the embodiment of FIG. 4A with the addition of a heat sink 34. Heat sink 34 would have a longitudinal slot to allow pyrometer 30 to view specimen 16 at all times during the relative movement.

The embodiment with the heat sink would be preferable for processes which require a long process time (i.e., greater than 3 seconds). The embodiments of FIGS. 2A and 3, where the total specimen is illuminated at one time, are preferable for processes which have uneven step functions. For instance, a process may require the specimen to be heated at 400° for some period of time and then be heated at 900° for another period of time. The scan line embodiments of FIG. 4A and FIG. 5 work best where only a single temperature for the process is needed.

The specimen could be heated from the bottom as well as the top, such as in the manner shown in U.S. Pat. No. 4,755,654.

The present invention provides advantages over the prior art method of using lasers to heat the film without heating the substrate. The laser light is monochromatic, and thus the absorption characteristic is very sensitive to the film thickness and any additional coatings over the film such as a thin dielectric layer, which is typically on the order of one-fourth to one-half of the laser wavelength. Variations in film thickness due to processing limits will vary the absorption, and interference effects will be caused because of the film's thickness being a fraction of the wavelength. The present invention, which preferably uses polychromatic light, has a range of wavelengths close to the desired wavelength. This is preferably accomplished using a gas-discharge lamp with a gas having a spectral output which peaks over a range of wavelengths having an energy greater than the energy gap of the film. Thus, the method of the present invention will not be affected by slight variations in the thickness of the film. In addition, by matching the wavelength to the absorption characteristics of the material, power is not wasted by generating wavelengths which are not maximally absorbed or by generating a range of wavelengths which are not absorbed at all.

The present invention can be used in many other processes as well. For example, implant annealing in semiconductor processing could be done with the method of the present invention. All of the processes in processing a semiconductor wafer are candidates for use of the present invention. Thin films can be deposited using the method of the present invention. In this embodiment, the film is in gaseous form and reacts with the heated layer on the substrate. Thus, the heating is coincident with the applying of the film to the substrate.

As will be understood by those familiar with the art, the present invention may be embodied in other specific forms without departing from the spirit or essential characteristics thereof. For example, an array of lamps could be used instead of a single lamp. Accordingly, the disclosure of the preferred embodiment of the invention is intended to be illustrative, but not limiting, of the scope of the invention which is set forth in the following claims.

What is claimed is:

1. A method for selectively heating a film on a substrate, comprising the steps of:
   selecting said film to be amorphous;
   selecting said substrate and said film to have different light absorption characteristics;
   illuminating said film and substrate with a source of light having a peak wavelength that will be substantially absorbed by said film and substantially not absorbed by said substrate; and
   continuing to illuminate said film and substrate until said film is converted from amorphous to crystalline form.

2. A method for selectively heating a film on a substrate, comprising the steps of:
   selecting said substrate and said film to have different light absorption characteristics;
   illuminating said film and substrate with a source of light having a peak wavelength that will be substantially absorbed by said film and substantially not absorbed by said substrate; and
   selecting said substrate to be transparent and said film to be opaque.

3. A method for selectively heating a film on a substrate, comprising the steps of:
   selecting said substrate and said film to have different light absorption characteristics;
   illuminating said film and substrate with a source of light having a peak wavelength that will be substantially absorbed by said film and substantially not absorbed by said substrate; and
   wherein said film on a substrate is used for a flat panel display.

4. The method of claim 3 wherein said film is amorphous silicon prior to said illuminating step and said substrate is glass.

5. The method of claim 4 wherein said illuminating step crystallizes said amorphous silicon.

6. A method for selectively heating a film on a substrate, comprising the steps of:
   selecting said substrate and said film to have different light absorption characteristics;
   illuminating said film and substrate with a source of light having a peak wavelength that will be substantially absorbed by said film and substantially not absorbed by said substrate; and
   wherein said film on a substrate is used as a solar cell.

7. The method of claim 6 wherein said film is cadmium sulfite and said substrate is glass.

8. A method for selectively heating a film on a substrate, comprising the steps of:
   selecting said substrate and said film to have different light absorption characteristics;
   illuminating said film and substrate with a source of light having a peak wavelength that will be substantially absorbed by said film and substantially not absorbed by said substrate; and
   wherein said illuminating step is performed during an implant anneal process.

9. A method for selectively heating a film on a substrate, comprising the steps of:
   selecting said substrate and said film to have different light absorption characteristics;

illuminating said film and substrate with a source of light having a peak wavelength that will be substantially absorbed by said film and substantially not absorbed by said substrate; and wherein said illuminating step is performed during a deposition of said film on said substrate.

10. A method for selectively heating a film on a substrate, comprising the steps of:

selecting said substrate and said film to have different light absorption characteristics;

illuminating said film and substrate with a source of light having a peak wavelength that will be substantially absorbed by said film and substantially not absorbed by said substrate; and wherein said film is metal and said substrate is silicon.

11. A method for selectively heating a film on a substrate, comprising the steps of:

selecting said substrate and said film to have different light absorption characteristics;

illuminating said film and substrate with a source of light having a peak wavelength that will be substantially absorbed by said film and substantially not absorbed by said substrate; and providing a heat sink coupled to said substrate.

12. A method for selectively heating a film on a substrate, comprising the steps of:

selecting said substrate and said film to have different light absorption characteristics;

illuminating said film and substrate with a source of light having a peak wavelength that will be substantially absorbed by said film and substantially not absorbed by said substrate; and wherein said illuminating step is accomplished with a single long-arc gas-discharge lamp and further comprising the step of detecting the temperature of said film with a pyrometer.

13. A product made by the process of claim 1.

14. A method for selectively heating a first material which is coupled to a second material, comprising the steps of:

selecting said first material to have an energy band gap smaller than an energy band gap of said second material;

irradiating said first and second material with a light source which has a maximum output at a wavelength with an energy greater than said energy band gap of said first material and less than said energy band gap of said second material.

* * * * *